United States Patent
Pacier et al.

(10) Patent No.: US 12,400,894 B2
(45) Date of Patent: Aug. 26, 2025

(54) AUTOMATED BATCH PRODUCTION THIN FILM DEPOSITION SYSTEMS AND METHODS OF USING THE SAME

(71) Applicant: Veeco Instruments Inc., Plainview, NY (US)

(72) Inventors: Michael W. Pacier, Leominster, MA (US); Michael J. Sershen, Cambridge, MA (US); Adam F. Bertuch, South Hamilton, MA (US); Laurent Lecordier, Arlington, MA (US); Thousif Ahamad Khan Hosakote Buden, Karnataka (IN); Ramesh Prasad Manchaladore Narahari Rao, Karnataka (IN)

(73) Assignee: Veeco Instruments Inc., Plainview, NY (US)

( * ) Notice: Subject to any disclaimer, the term of this patent is extended or adjusted under 35 U.S.C. 154(b) by 832 days.

(21) Appl. No.: 17/310,680

(22) PCT Filed: Feb. 19, 2020

(86) PCT No.: PCT/US2020/018786
§ 371 (c)(1),
(2) Date: Aug. 17, 2021

(87) PCT Pub. No.: WO2020/172244
PCT Pub. Date: Aug. 27, 2020

(65) Prior Publication Data
US 2022/0076976 A1    Mar. 10, 2022

Related U.S. Application Data

(60) Provisional application No. 62/807,612, filed on Feb. 19, 2019.

(51) Int. Cl.
*H01L 21/67* (2006.01)
*C23C 16/455* (2006.01)
(Continued)

(52) U.S. Cl.
CPC .. *H01L 21/67754* (2013.01); *C23C 16/45544* (2013.01); *C23C 16/52* (2013.01);
(Continued)

(58) Field of Classification Search
CPC ......... H01L 21/67303; H01L 21/67313; H01L 21/67754; H01L 21/67781; H01L 21/68707; C23C 16/45544; C23C 16/52
(Continued)

(56) References Cited

U.S. PATENT DOCUMENTS 5,516,732 A    5/1996  Flegal
2001/0052392 A1  12/2001  Nakamura et al.
(Continued)

FOREIGN PATENT DOCUMENTS

EP    0452939 A1    10/1991
JP    H11312727 A   11/1999
(Continued)

*Primary Examiner* — Monica D Harrison
(74) *Attorney, Agent, or Firm* — Downs Rachlin Martin PLLC

(57) ABSTRACT

Fully automated batch production thin film deposition systems configured to deliver uniformity combined with high throughput at a low cost-per-wafer. In some examples, systems of the present disclosure include automated safe wafer handling via low-impact batch transfer via transportable wafer racks loaded with a plurality of wafers. In some examples, systems include a modular pre-heat & cool-down architecture that enables a flexible thermal management solution tailored around particular specifications.

5 Claims, 13 Drawing Sheets

(51) Int. Cl.
*C23C 16/52* (2006.01)
*H01L 21/677* (2006.01)
*H01L 21/673* (2006.01)
*H01L 21/687* (2006.01)

(52) U.S. Cl.
CPC .. *H01L 21/67781* (2013.01); *H01L 21/67303* (2013.01); *H01L 21/67313* (2013.01); *H01L 21/68707* (2013.01)

(58) Field of Classification Search
USPC .......................................................... 438/578
See application file for complete search history.

(56) References Cited

U.S. PATENT DOCUMENTS

| | | |
|---|---|---|
| 2002/0159864 A1 | 10/2002 | Lowrance |
| 2003/0017034 A1 | 1/2003 | Davis et al. |
| 2003/0098125 A1 | 5/2003 | An |
| 2007/0295274 A1 | 12/2007 | Webb et al. |
| 2010/0173495 A1 | 7/2010 | Thakur et al. |
| 2014/0271054 A1 | 9/2014 | Weaver et al. |
| 2015/0063957 A1 | 3/2015 | Olgado |
| 2017/0067163 A1* | 3/2017 | Papasouliotis .......... C23C 16/50 |
| 2018/0342412 A1 | 11/2018 | Miyoshi et al. |

FOREIGN PATENT DOCUMENTS

| | | |
|---|---|---|
| JP | 2005203458 A | 7/2005 |
| KR | 20110105496 A | 9/2011 |
| WO | 2007126289 A1 | 11/2007 |

* cited by examiner

AUTOMATED BATCH PRODUCTION THIN FILM DEPOSITION SYSTEMS AND METHODS OF USING THE SAME

RELATED APPLICATION DATA

This application claims the benefit of priority of U.S. Provisional Patent Application Ser. No. 62/807,612, filed Feb. 19, 2019, and titled Automated Batch Production Atomic Layer Deposition Systems and Methods of Using the Same, which is incorporated by reference herein in its entirety.

FIELD OF THE INVENTION

The present invention generally relates to the field of thin film deposition systems. In particular, the present invention is directed to automated batch production thin film deposition systems and methods of using the same.

BACKGROUND

Thin film deposition processes are used to apply insulating, dielectric and conductive thin film layers onto various substrates and components such as semiconductor substrates, semiconductor circuit devices, and onto transparent and semitransparent glasses and other substrates, used in optical and electro-optical devices. In a chemical vapor deposition (CVD) process such as atomic layer deposition (ALD), the wafers are often individually aligned and loaded into wafer carriers, which are then carefully placed within a reaction chamber of the CVD reactor. When a chemical reaction is complete, the hot wafer carriers and wafers must be carefully removed from the reaction chambers. In some systems, after the thin film deposition process is complete, hot and brittle wafers are individually removed from the reactor. Such individual handling increases the likelihood that a wafer will break and limits the throughput of the CVD system.

SUMMARY OF THE DISCLOSURE

In one implementation, the present disclosure is directed to a vacuum transfer module (VTM) for an automated thin film deposition system configured for batch processing of substrates. The VTM includes a vacuum chamber having a plurality of openings configured to be coupled to thin film deposition process modules; and a robotic arm located within the chamber, the robotic arm having an end effector configured to couple to a transportable substrate rack, the transportable substrate rack configured to hold a plurality of substrates; wherein the robotic arm is configured to selectively move the transportable substrate rack through one or more of the openings and deposit the transportable substrate rack within a corresponding one of the thin film deposition process modules for processing the plurality of substrates loaded on the transportable substrate rack.

In another implementation, the present disclosure is directed to a semiconductor processing system. The system includes a vacuum transfer module (VTM) that includes a vacuum chamber, a robotic arm located in the vacuum chamber, and a plurality of openings; a plurality of thin film deposition process modules including a preheat chamber, a reactor, a load lock, and a load station; at least one transportable wafer rack, the at least one transportable wafer rack configured to hold a plurality of semiconductor wafers; wherein the preheat chamber, reactor, and load lock are each coupled to a corresponding respective one of the plurality of openings and the load station is coupled to the load lock, wherein the robotic arm is configured to automatedly and selectively transfer the transportable wafer rack between the load lock, preheat chamber, and reactor for automated batch processing of a plurality of wafers loaded on the transportable wafer rack.

In yet another implementation, the present disclosure is directed to a method of performing a thin film deposition process with a thin film deposition system that includes a vacuum transfer module (VTM), a VTM robot located in the VTM, a load lock, a preheat chamber, a thin film deposition reactor, and at least one transportable wafer rack. The method includes a first transfer, with the VTM robot, of the at least one transportable wafer rack from the load lock, through the VTM, to the preheat chamber, the at least one transportable wafer rack loaded with a plurality of wafers; heating the at least one transportable wafer rack and the plurality of wafers in the preheat chamber; a second transfer, with the VTM robot, of the at least one transportable wafer rack and the plurality of wafers from the preheat chamber, through the VTM, to the reactor; performing a thin film deposition process on the plurality of wafers in the reactor; a third transfer, with the VTM robot, of the at least one transportable wafer rack and the plurality of wafers from the reactor, through the VTM, to the load lock; and performing a controlled cool down process on the at least one transportable wafer rack and plurality of wafers in the load lock.

In yet another implementation, the present disclosure is directed to a control system for controlling a thin film deposition system, the thin film deposition system including a vacuum transfer module (VTM), a VTM robot located in the VTM, a load lock, a preheat chamber, a thin film deposition reactor, and at least one transportable wafer rack. The control system includes a processor and a memory containing machine-readable instructions for causing the processor to control the thin film deposition system to perform operations comprising: a first transfer, with the VTM robot, of the at least one transportable wafer rack from the load lock, through the VTM, to the preheat chamber, the at least one transportable wafer rack loaded with a plurality of wafers; heating the at least one transportable wafer rack and the plurality of wafers in the preheat chamber; a second transfer, with the VTM robot, of the at least one transportable wafer rack and the plurality of wafers from the preheat chamber, through the VTM, to the reactor; performing a thin film deposition process on the plurality of wafers in the reactor; a third transfer, with the VTM robot, of the at least one transportable wafer rack and the plurality of wafers from the reactor, through the VTM, to the load lock; and performing a controlled cool down process on the at least one transportable wafer rack and plurality of wafers in the load lock.

In yet another implementation, the present disclosure is directed to a non-transitory machine-readable storage medium containing machine-readable instructions configured to cause a processor of thin film deposition system that includes a vacuum transfer module (VTM), a VTM robot located in the VTM, a load lock, a preheat chamber, a thin film deposition reactor, and at least one transportable wafer rack, to perform operations, which includes a first transfer, with the VTM robot, of the at least one transportable wafer rack from the load lock, through the VTM, to the preheat chamber, the at least one transportable wafer rack loaded with a plurality of wafers; heating the at least one transportable wafer rack and the plurality of wafers in the preheat chamber; a second transfer, with the VTM robot, of the at least one transportable wafer rack and the plurality of wafers from the preheat chamber, through the VTM, to the reactor; performing a thin film deposition process on the plurality of wafers in the reactor; a third transfer, with the VTM robot, of the at least one transportable wafer rack and the plurality of wafers from the reactor, through the VTM, to the load lock; and performing a controlled cool down process on the at least one transportable wafer rack and plurality of wafers in the load lock.

In yet another implementation, the present disclosure is directed to a transportable wafer rack. The transportable wafer rack includes a base plate, a top plate, and a plurality of columns disposed between the base and top plates, each of the plurality of columns including a plurality of recesses for supporting a plurality of wafers slidably disposed between the base plate and the top plate; and an interface disposed on the base plate, the interface configured and dimensioned to couple to an end effector of a robotic arm for transporting the transportable wafer rack and the plurality of wafers disposed thereon between a plurality of thin film deposition process modules for processing the wafers.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Aspects of the present disclosure include fully automated batch production thin film deposition systems configured to deliver uniformity combined with high throughput at a low cost-per-wafer. Example embodiments disclosed herein refer to semiconductor wafers and transportable wafer racks, however, systems of the present disclosure can also be used to apply thin film processing to substrates other than semiconductor wafers. In some examples, systems include automated safe wafer handling via low-impact batch transfer. In some examples, systems of the present disclosure have a modular pre-heat & cool-down design that enables a flexible thermal management solution tailored around particular specifications. In some examples, automated batch thin film deposition systems of the present disclosure incorporate high capacity reactor(s), low consumable and maintenance costs, and a compact footprint.

Aspects of the present disclosure also include a robust and flexible reactor design with seamless wafer size transition capability all the way up to, e.g., 300 mm wafers. In some examples, a system can be easily configured to achieve optimal throughput for a particular wafer size, for example, 100 mm, 150 mm, 200 mm and/or 300 mm. In some examples, systems allow for concurrent processing at a plurality, e.g., 2 or more different wafer sizes, e.g. 100 mm and 150 mm. Such concurrent size capability facilitating process development and production scaling. Aspects of the present disclosure also include a modular architecture providing configurability advantages that can be effectively tailored to minimize process flow bottlenecks and offer excellent processing flexibility.

Aspects of the present disclosure also include a reduced cost per wafer from small batch pre-production evaluation all the way to ramped-up production. In one example, systems of the present disclosure may provide throughputs of up to 40,000 wafers a month, for example (assuming an atomic layer deposition (ALD) process for 100 nm $Al_2O_3$ thickness and 100 wafers per batch), combining productivity, superior film performance and low cost of operation.

In some examples, systems of the present disclosure may be optimized for oxide films, including encapsulation & barrier layers and optical coating. Aspects may also include high throughput, automation, and safe wafer handling for fragile and/or temperature sensitive substrates (e.g., LNO, LTO, glass, III-V); and modular thermal management for optimal process flexibility and throughput.

Figure 1A:
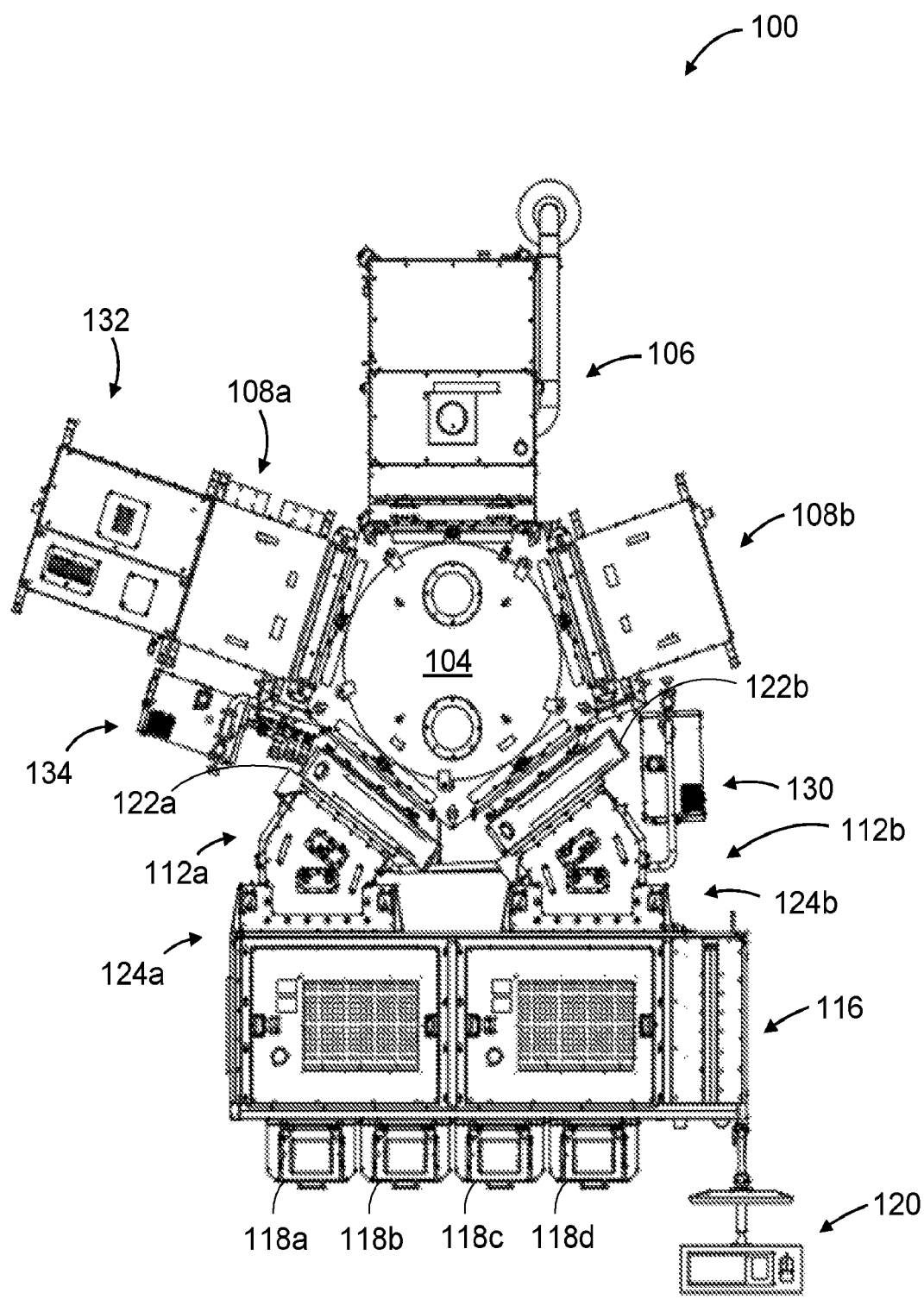
FIG. 1A is a top view of one example of a modular thin-film deposition system of the present disclosure.
Figure 1B:
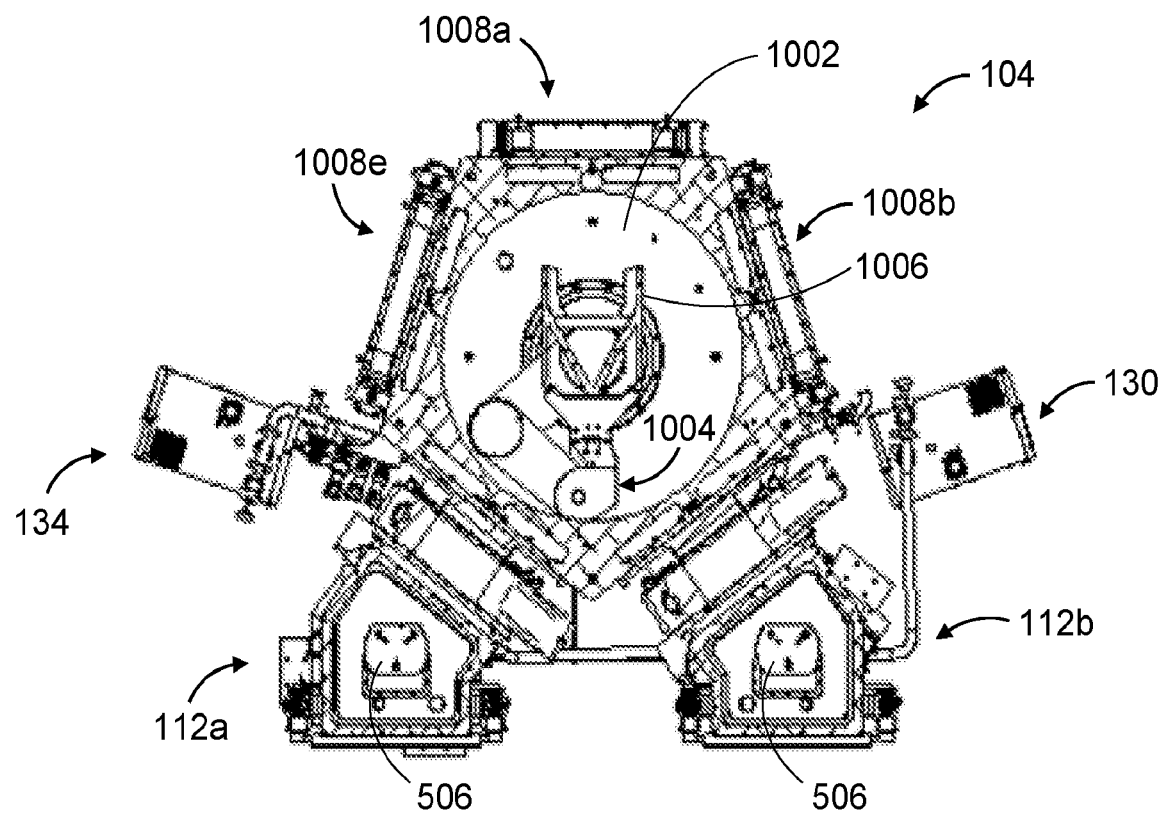
FIG. 1B is a top view of the vacuum transfer module (VTM) and load locks of the system of FIG. 1A with the tops removed to show the interior chambers of those components, including a robotic arm in the VTM and turntables in the load locks.

Referring to FIGS. 1A and 1B, one example of a modular a thin film deposition system 100 is depicted in accordance with an embodiment of the disclosure. System 100 includes a central vacuum transfer module (VTM) 102 that includes an outer structure 104 that defines an interior chamber 1002 designed to be maintained at vacuum pressures with respect to atmospheric pressure, for example, vacuum pressures in the range of 1 Torr to 500 Torr. In the illustrated example, VTM 102 has a pentagon shaped footprint defining five sides that each have an opening 1008 (three labeled in FIG. 1B) configured to be operably coupled to a corresponding module of the system. In the illustrated example, VTM 102 is coupled to a thin film deposition reactor 106 which may be any of a variety of thin film deposition reactors known in the art, such as an atomic layer deposition (ALD) reactor. In one example, reactor 106 may be an ALD reactor having one or more features as described in U.S. Pat. No. 9,175,388, titled "Reaction chamber with removable liner"; U.S. Pat. No. 9,328,417, titled "System and method for thin film deposition"; and U.S. Pat. No. 9,777,371, titled, "ALD systems and methods," the contents of which are hereby incorporated by reference herein in their entireties. In one example, reactor 106 may be a Phoenix™ ALD Reactor manufactured by Veeco Instruments Inc. Reactor 106 may include a reactor chamber that is configured and dimensioned to receive one or more transportable wafer racks, such as wafer racks 200 and 300 (FIGS. 2 and 3).

VTM 102 is also coupled to a first preheat chamber 108a and a second preheat chamber 108b for preheating a transportable wafer rack loaded with one or more columns of wafers prior to processing the wafers in reactor 106. System 100 also includes a first load lock 112a and a second load lock 112b that are each operably coupled to VTM 102 for transferring wafer racks between the vacuum environment within the VTM chamber and the ambient environment. System 100 also includes a load station 116 for transferring wafers between wafer cassettes located in one of load ports 118a-d of the load station and transportable wafer racks located in load locks 112. System 100 also includes a user interface 120 for receiving user input for controlling system 100.

VTM 102 may include at least one robot 1004 (see FIGS. 1B and 10) for automatedly transporting racks of wafers between the various modules of system 100. Load station 116 may also include at least one robot (see FIG. 4) for automatedly transporting individual wafers between wafer cassettes located in load ports 118 and wafer racks located in load locks 112. System 100 also includes a series of doors and valves controlled by a control system for controlling the environment within the various modules of the system. In the illustrated embodiment, pendulum gate valves 122a, 122b, are located between the load locks 112 and VTM 102 and atmospheric doors 124a, 124b are located between each of the load locks and load station 116. In one example, gate valves 122 are ISO500 pendulum gate valves and define a 500 mm diameter opening which is sufficient for allowing VTM robotic arm 1004 (FIG. 10) to access a wafer rack located in a load lock 112 and transport the wafer rack and wafers through the opening in the corresponding gate valve 122 and into VTM 102. System 100 also includes large format heated gate valves 126a and 126b for isolating each of the preheat chambers 108 from the VTM chamber. In one example, heated gate valves 126 define an opening having a size that is approximately 450 mm×260 mm, which is sufficient for allowing VTM robotic arm 1004 to transport wafer racks between the VTM chamber and the preheat chamber. Heated gate valves 126 include heating elements for heating the door of the valve to maintain a temperature of the preheat-chamber side of the door at approximately the same temperature as an interior of the pre-heat chamber during heating. FIG. 1B is a top view of VTM 102 and load locks 112 with the tops of those components removed to show the interior chambers of those components, including robotic arm 1004 in the VTM and turntables 506 in the load locks.

The modular nature of system 100 allows it to be readily modified according to specific processing needs such as volume of production, type of substrate, and type of thin films being deposited. For example, one of preheat chambers 108 can be replaced with a second reactor 106 which may be the same or a different type of reactor as reactor 106, or one of load locks 112 may be replaced with a preheat chamber 108 or reactor 106 or other wafer processing module. In yet other examples, alternate VTMs may be provided that have a greater number of openings than five for coupling to more than five modules, for example, VTMs made in accordance with the present disclosure may have a hexagon, heptagon, or octagon, etc. outer shape with a corresponding six seven or eight sides with openings, or the VTM may have an elongate rectangular shape with any number of openings and corresponding modules, etc.

System 100 may be used to concurrently process batches of wafers by locating the batches of wafers on transportable wafer racks (see, e.g., FIGS. 2A, 2B, 3A, and 3B) that are transported throughout the system. Locating wafers on transportable wafer racks enables processing batches of wafers while only handling the wafers at room temperature when initially loading the wafer racks and not at elevated temperatures, which is particularly beneficial for unusually brittle wafers, such as, for example, LNO, LTO, glass, and III-V wafers. The modular nature of system 100 enables efficient thermal management by decoupling time-consuming preheat and cool down stages from the thin film deposition process that occurs within the reactor. For example, in the example illustrated in FIG. 1, while one transportable wafer rack is being processed in reactor 106, a second transportable wafer rack can be heated in one of preheat chambers 108 and a third transportable wafer rack that has already been processed in reactor 106 can be cooled down in one of load locks 112 while a fourth transportable wafer rack located in the other one of load locks can be loaded with wafers for processing. The transportation and processing of entire racks of wafers throughout system 100 also enables the concurrent processing of a plurality of wafer sizes. For example, as described more below, system 100 may include a plurality of transportable wafer racks each configured to carry different size wafers, but each having a universal interface for coupling with the VTM robot and load lock. Exemplary aspects of the components of system 100 are described below.

Transportable Wafer Rack

Figure 2A:
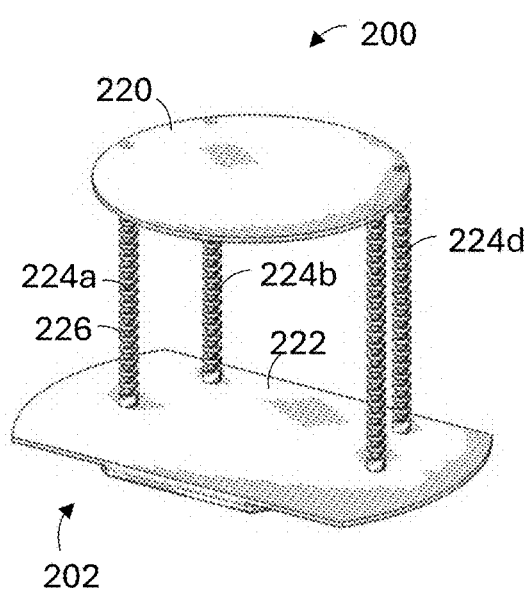
FIG. 2A shows a top perspective view of a single column transportable wafer rack that is empty, i.e., not loaded with wafers.
Figure 2B:
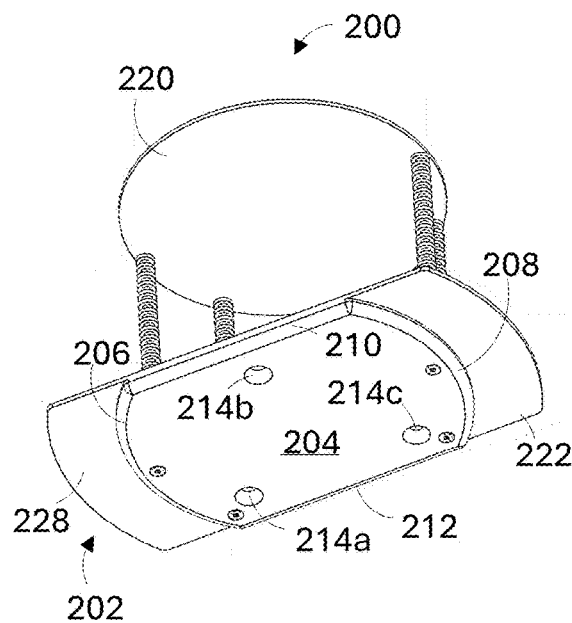
FIG. 2B shows a bottom perspective view of the single column transportable wafer rack of FIG. 2A.
Figure 3A:
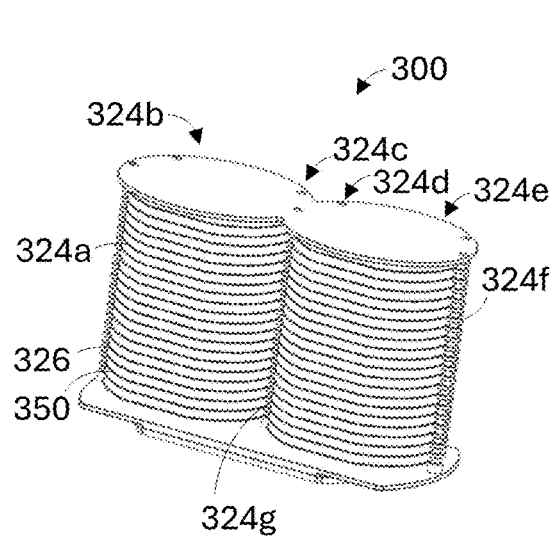
FIG. 3A shows a top perspective view of a dual column transportable wafer rack that is loaded with a plurality of wafers.
Figure 3B:
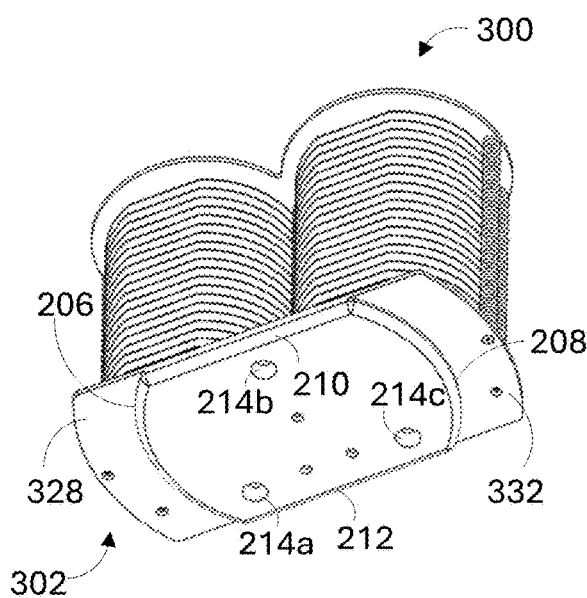
FIG. 3B shows a bottom perspective view of the dual column transportable wafer rack of FIG. 2A.

FIGS. 2A and 2B show one example of a single-column wafer rack 200 and FIGS. 3A and 3B show one example of a two-column transportable wafer rack 300. In the illustrated example, rack 200 may be approximately 8 in high and 13 in wide and configured and dimensioned to hold approximately 20-30 200 mm-300 mm wafers. Dual-column rack 300 may be approximately 8 in high and 13 in wide and configured and dimensioned to hold two columns, each column containing 20-30 150 mm wafers. In other examples, transportable wafer racks may be configured to carry three or more columns of wafers. Rack 200 and rack 300 each include a base 202, 302 that includes the same universal interface 204 configured to interface with an end effector 1006 of a robot 1004 in VTM 102 (see FIG. 10) and a turntable 506 in load locks 112 (see FIG. 5). Interface 204 has an outer shape that is complementary to the size and shape of an recess 1102 (FIG. 11) in end effector 1006 of VTM robot 1004 for mating with the end effector. In the illustrated example, interface 204 stands proud of base 202 and base 302 and has first and second curved ends 206, 208 and first and second flat sides 210, 212. Interface 204 also includes a plurality of tapered recesses 214a-214c having a complementary shape and configured to align with corresponding tapered protrusions 714a-714c on the load lock turntable 506. As will be appreciated by a person having ordinary skill in the art, any of a variety of number of recesses, pattern of recesses, and shape of each of the recesses may be used in combination with corresponding protrusions on the turntable, the particular arrangement shown in the present application selected for both ornamental and functional reasons. In other examples, other mating features may be used for defining a particular lateral and rotational position of racks 200, 300 relative to end effector 1006, turntable 506, or other component of system 100 or otherwise securing or coupling the rack. For example, interface 204 may be recessed rather than extend from base 202, 302 and be sized to receive a correspondingly shaped protrusion.

Single column transportable wafer rack 200 includes a top plate 220 and a bottom plate 222 that are positioned in a spaced and parallel relationship by a plurality of columns 224a-224d for receiving and supporting a plurality of wafers or other substrates therebetween. Each of columns 224 includes a plurality of recesses 226 (only one labeled) that are sized and configured to receive and support an edge of a wafer, the spacing of adjacent recesses defining a spacing between adjacent wafers in the rack. In the illustrated example, rack 200 includes four columns, columns 224a and 224c are located at opposing sides of the top plate 220 at an approximate midpoint of the top plate for supporting wafers at an approximate centerline of the wafers. Columns 224b and 224d are located on one half of the top plate for supporting one side of wafers and acting as a backstop for wafers inserted into the rack from an opposing side of the rack. Bottom plate 222 has a larger width than top plate 220, a bottom surface 228 of the bottom plate configured as a lifting surface for end effector 1006 of VTM robot 1004 to come into contact with and press against when lifting the rack. The relatively wide bottom plate 222 also resulting in rack 200 being stably supported on the end effector.

Dual column transportable wafer rack 300 includes a top plate 320 and a bottom plate 322 that are positioned in a spaced and parallel relationship by a plurality of columns 324a-224g for receiving and supporting two columns of wafers 350 (only one labeled) therebetween. Each of columns 324 includes a plurality of recesses 326 (only one labeled) that are sized and configured to receive and support an edge of a wafer, the spacing of adjacent recesses defining a spacing between adjacent wafers in the rack. In the illustrated example, rack 300 includes seven columns, columns 324a, 324g, and 324f are located at opposing sides and a midpoint of top plate 320 at an approximate centerline of the top plate for supporting wafers at an approximate centerline of the wafers. Columns 324b, 324c, 324d, and 324e are located on one half of the top plate for supporting one side of the wafers and acting as a backstop for wafers inserted into the rack from an opposing side of the rack. Bottom plate 322 defines a bottom surface 328 configured as a lifting surface for end effector 1006 of VTM robot 1004 to come into contact with and press against when lifting the rack. The relatively wide bottom plate 322 also resulting in rack 300 being stably supported on the end effector.

In one example, racks 200 and 300 are configured to be oriented in a vertical position at all times throughout system 100 such that a central longitudinal axis of the column of wafers is substantially vertical, and are configured to be supported only at the base 202, 302 of the rack. Racks 200 and 300 are configured to be placed in specific locations in system 100 and lifted from the base by an end effector of a robotic arm, such as end effector 1006. Thus, as described more below, the entire rack 200 or 300 is transported in a vertical orientation from load lock 112, through gate valve 122 and into VTM 102, and from the VTM through heated gate valve 126 into and out of preheat chamber 108 and from the VTM into and out of reactor 106. In one example, rack 200 and 300 are maintained in the same vertical orientation at all times while being moved in and out of VTM 102. In other examples, transportable wafer racks made in accordance with the present disclosure may include additional coupling features for securely lifting and rotating the wafer rack, for example, rotating between vertical and horizontal positions. For example, when system includes a thin film deposition reactor configured to process wafers in a horizontal orientation. In yet other examples, system 100 may be configured to maintain the transportable wafer racks in a horizontal position, with a central longitudinal axis of the wafer column substantially horizontal, at all times throughout the system.

Transportable wafer racks 200 and 300 may be formed from any of a variety of materials, such as stainless steel, quartz, and/or ceramic materials. One benefit of the easily removable nature of racks 200, 300 is that they are easily removable for easy cleaning, replacement, and changing for different size wafers.

Load Station

Load station 116 is configured to receive wafer cassettes such as standard mechanical interface (SMIF) or front opening universal pod (FOUPS) cassettes, which are well known in the art. The wafer cassettes may be placed by an operator in one of load ports 118 for processing by system 100. In one example, system 100 can concurrently process multiple wafer sizes, for example, one or more of 150 mm, 200 mm, and 300 mm wafers. In one example, each load port 118 is configured to receive a wafer cassette holding a plurality of wafers, for example, up to 25 wafers, or up to 50 wafers.

Figure 4:
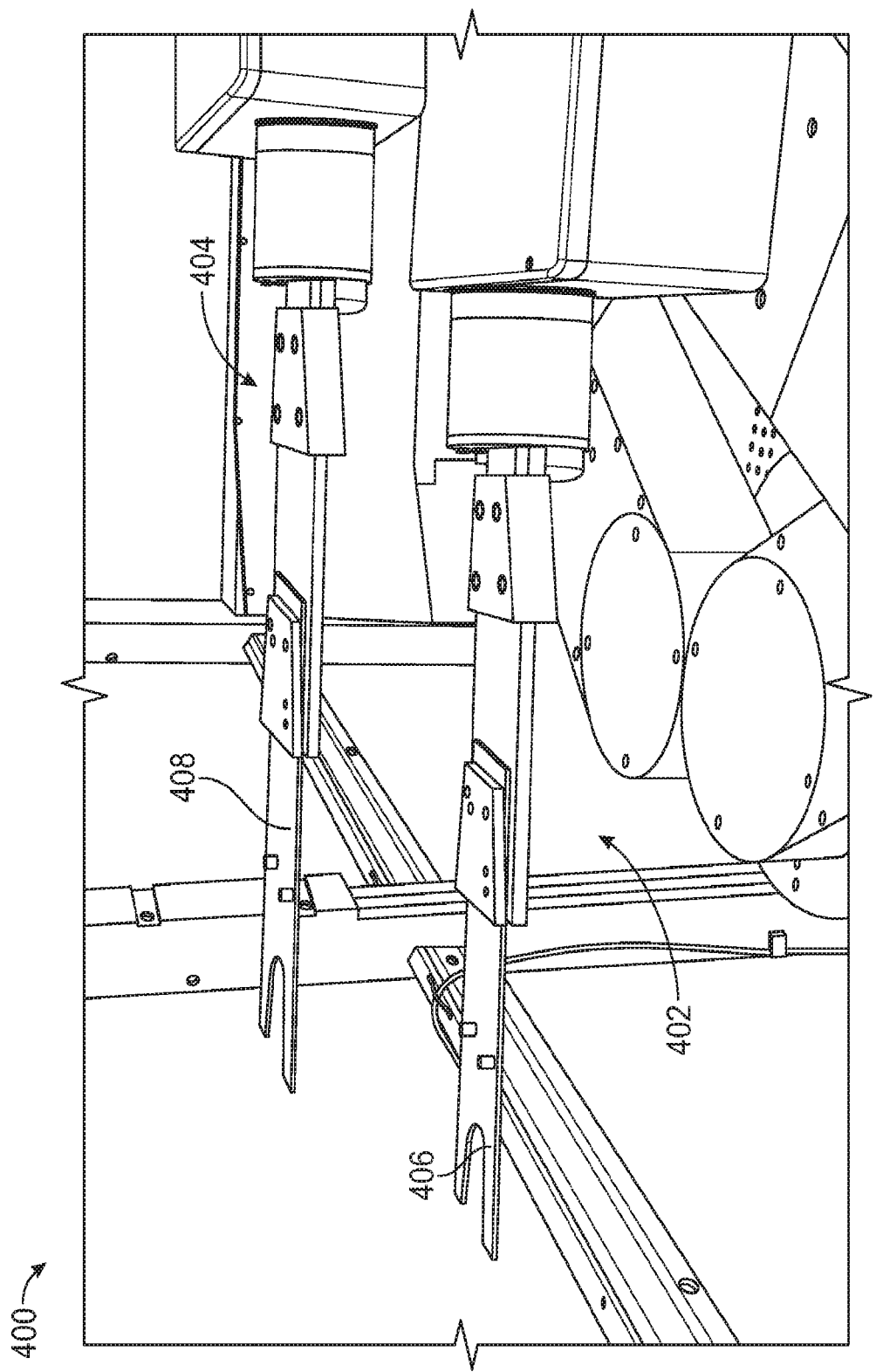
FIG. 4 shows a portion of an interior of a load station.

FIG. 4 illustrates a portion of an interior of one of example of load station 116. In the illustrated example, load station 116 includes at least one robot 400 for sequentially transferring individual wafers from wafer cassettes located in one of load ports 118 to a transportable wafer rack, e.g., wafer rack 200 or 300 (FIG. 2, 3) located in one of load locks 112. FIG. 4 illustrates one example of load station robot 400, which includes a pair of robotic arms 402, 404. In one example, each robotic arm includes a pivotable shoulder, a first arm segment, a pivotable elbow, a second arm segment, a pivotable wrist, and one or more end effectors 406, 408. In the illustrated example, end effectors 406 and 408 are sized for two different wafer sizes, e.g., end effector 406 is sized for 100 mm and 150 mm wafers and end effector 408 is sized for 150 mm and 200 mm wafers, such that load station 116 can automatedly load 100 mm, 150 mm, and 200 mm wafers into system 100 for concurrent processing. End effectors 406, 408 may also include vacuum chucks for securely gripping a wafer.

In one example, load station 116 includes a wafer ID reader (not illustrated) configured to read a machine-readable code on a wafer cassette and/or wafer loaded in load port 118 to determine the size of wafers loaded in the wafer cassette and then use the corresponding arm 402/404 for sequential transport of wafers. The dual-arm configuration of load station 116, therefore, enables processing of a plurality, e.g., two, different wafer sizes without any hardware change.

In one example, robot 400 in load station 116 is the only location in system 100 where single wafers are handled. In addition, the single wafers are handled at approximately room temperature and atmospheric conditions. After each wafer is loaded into one of load locks 112, the wafers are handled in batch and none of the wafers are directly contacted by an operator or by any robotic or other component of system 100 other than the transportable wafer rack supporting the wafer until the wafers have been processed and have cooled down to approximately room temperature in one of load locks 112.

Load station 116 may also include integrated HEPA filters, ionizer bars to prevent electrostatic discharge, and wafer aligners for determining an alignment of wafers in cassettes in load ports.

Load Locks

Figure 5:
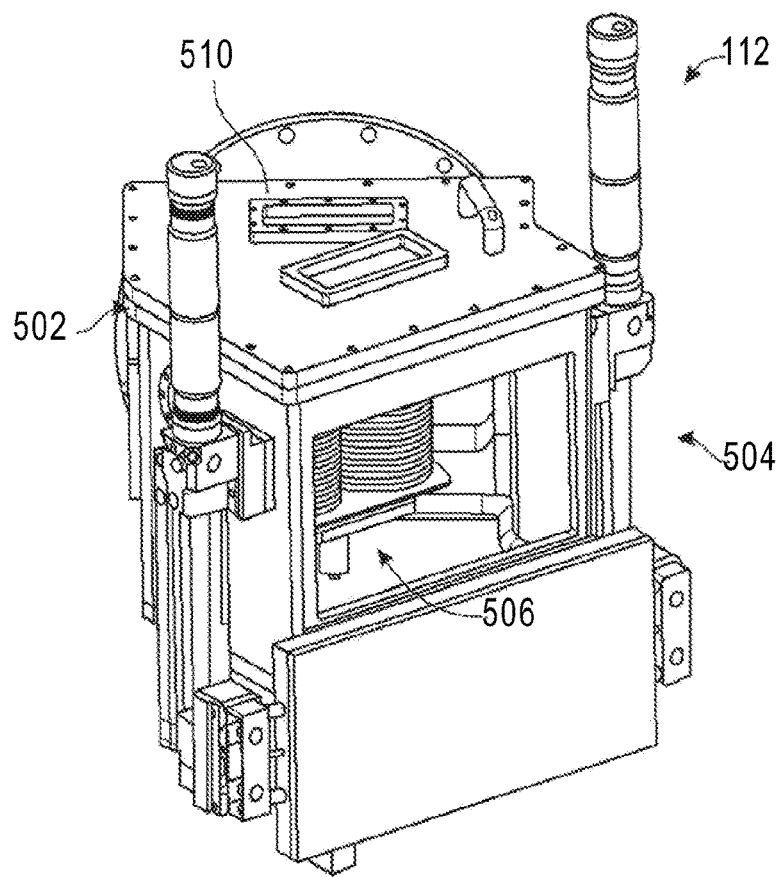
FIG. 5 shows a load lock with a dual column transportable wafer rack.
Figure 6:
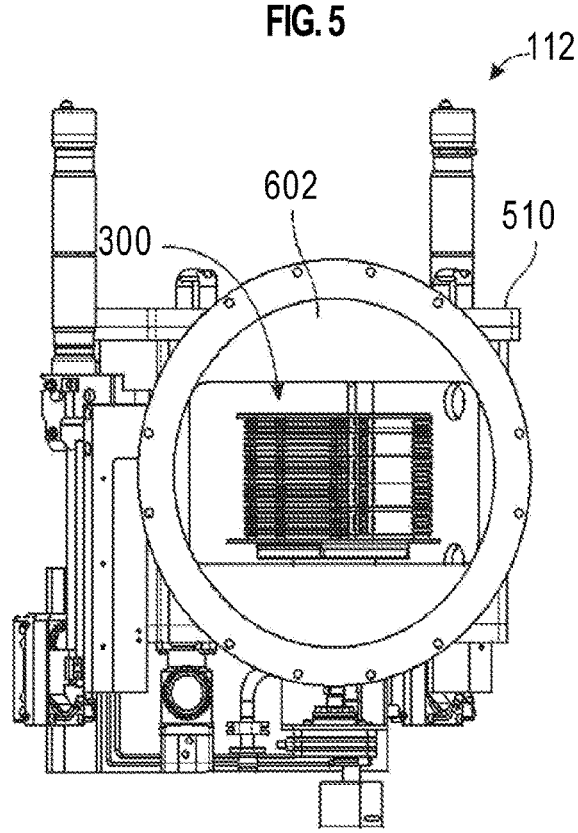
FIG. 6 is another view of the load lock of FIG. 5.

FIGS. 5 and 6 illustrate one of load locks 112. As shown, load lock 112 includes an enclosure 502 that defines a load lock chamber configured to be drawn down to a vacuum pressure with respect to atmosphere that is substantially the same as a vacuum pressure within VTM 102 (FIG. 1). Load lock 112 includes a load station opening 504 that is configured and dimensioned to be coupled to load station 116 and a VTM opening 602 (FIG. 6) that is configured and dimensioned to be coupled to VTM 102. In the illustrated example, load lock 112 also includes a turntable 506 that is rotatably disposed in the load lock and configured to removeably couple to and support a transportable wafer rack, e.g., wafer rack 300 shown in FIGS. 5 and 6, located on the turntable. In one example, the control system of system 100 is configured to position turntable 506 in a first rotational position for loading wafers onto wafer rack 300 and rotate the turntable to a second position for lifting and removing the wafer rack from the load lock with the VTM robotic arm.

Figure 7:
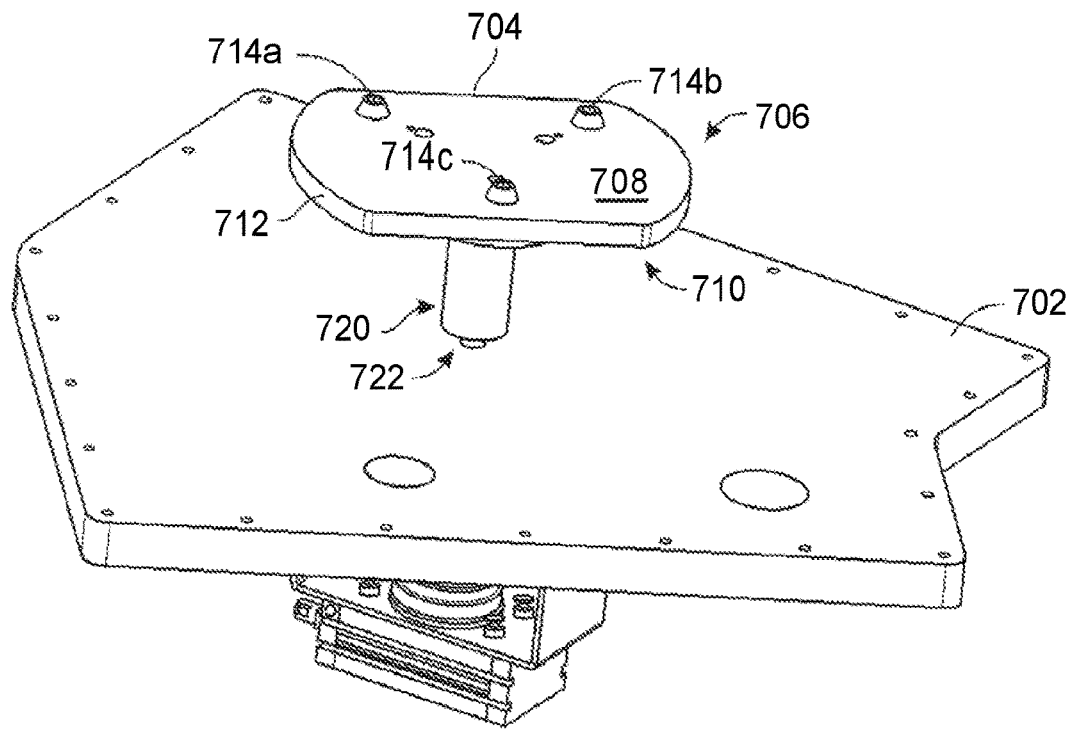
FIG. 7 is a top perspective view of a floor and turntable of the load lock of FIGS. 5 and 6.
Figure 8:
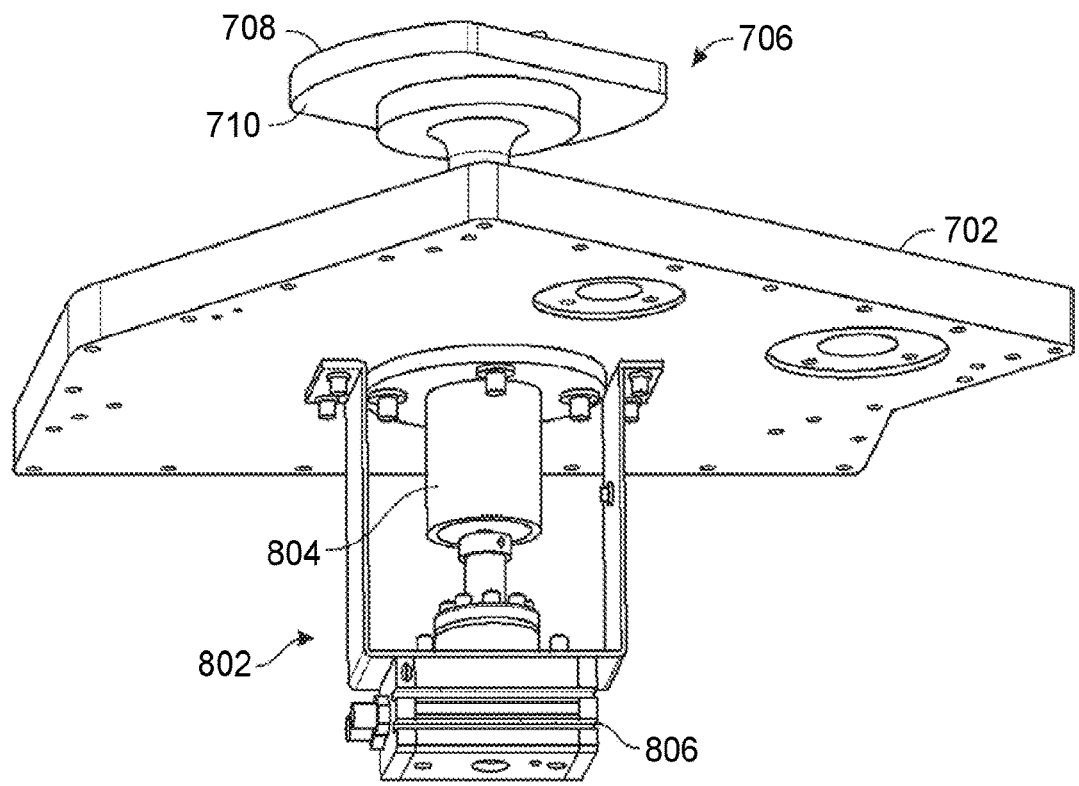
FIG. 8 is a bottom perspective view of the floor and turntable of FIG. 7.

FIGS. 7 and 8 show additional views of turntable 506 rotatably disposed in a floor 702 of load lock enclosure 502. In the illustrated example, turntable 506 includes a universal wafer rack interface 704 that is configured to couple to and support a plurality of wafer racks, including wafer rack 200 or 300 (FIGS. 2 and 3). The universal wafer rack interface 704 includes a plate 706 having a top surface 708 configured to face a bottom surface of a wafer rack, an opposing bottom surface 710 and an outer perimeter 712, the outer perimeter having a shape that is configured and dimensioned to have a complementary shape with respect to an end effector 1006 of a robotic arm 1004 of VTM 102 (See, e.g., FIGS. 10 and 11) such that a VTM robotic arm end effector may be positioned around at least a portion of outer perimeter 512 and then be moved in a vertical direction to lift a transportable wafer rack holding a plurality of wafers off of turntable 506 to transport the wafer rack into VTM 102. Plate 706 includes a plurality of tapered protrusions 714a-714c that are configured to align with tapered recesses 214a-214c of interface 204 of wafer racks 200 and 300.

As shown in FIGS. 7 and 8, a rotation of turntable 506 is driven by a rotary drive system 802 located below floor 702 and coupled to turntable 506 via a shaft 720 that extends through the floor via a vacuum feedthrough 722 resulting in all moving parts being external to the vacuum environment of the load lock 112, thereby ensuring a low level of particle generation in the wafer environment. In the illustrated example, rotary drive system 802 includes a rotary drive 804 and a rotary actuator 806, the rotary actuator pneumatically controlled and including reed switches for controlling a rotational position of the turntable. In other examples, the load lock may have a stationary platform for supporting wafer racks rather than a rotatable turntable. In one example, the control system may be configured to control a rotational position of turntable 506 so that the transportable wafer rack is in the precise rotational position required for subsequent placement in reactor 106. After obtaining the correct rotational position, the VTM robot may be configured to maintain the correct position throughout transport into and out of preheat chamber 108 and reactor 106.

In one example, load locks 112 each include presence sensors for reliable vacuum transfers, protrusion sensors for ensuring proper wafer placement on wafer racks, and viewports to facilitate teaching the VTM robot 1004 and load station robots 400. The viewports provide operators with clear visual access to make sure the VTM and load station end effectors 1006, 406, 408 are correctly positioned with respect to the wafer racks 200, 300 and allow the operators to check and teach the position of both robot end effectors without requiring the removal of the load lock lid 510.

Each load lock 112 is coupled to a pressure and flow control system 130 for controlling the environment within the load lock chamber. After new wafers are loaded onto wafer racks 200, 300 in the load lock chamber, the pressure and flow control system 130 is configured to purge the load lock chamber and reduce the pressure in the chamber to a vacuum pressure. As described more below, after wafers have been processed, the rack of wafers are returned to one of the load locks 112 for a controlled cooldown. Pressure and flow control system 130 may be configured to inject one or more gases, such as nitrogen, argon, or helium, and follow any of a variety of pressure and temperature sequences depending on the particular wafers or substrates being processed, to achieve a target cooldown sequence. A particular cooldown sequence can be important to minimize or avoid creating thermal stresses in the wafers, which can occur from improper cooldown, which can lead to wafer damage. In one example, a cooldown process includes three components: purge flow, load lock chamber pressure, and time. In one example, a cooldown process may include (1) reducing a pressure of the load lock to a target vacuum pressure (2) isolating the chamber with a transportable wafer rack and recently-processed wafers; (3) purging the chamber with a purge gas, such as nitrogen for a specified period of time; (4) stopping purge and holding for a specified period of time; (5) incrementally increasing pressure; and (6) repeating steps 3-5 until atmospheric pressure is reached.

Figure 9:
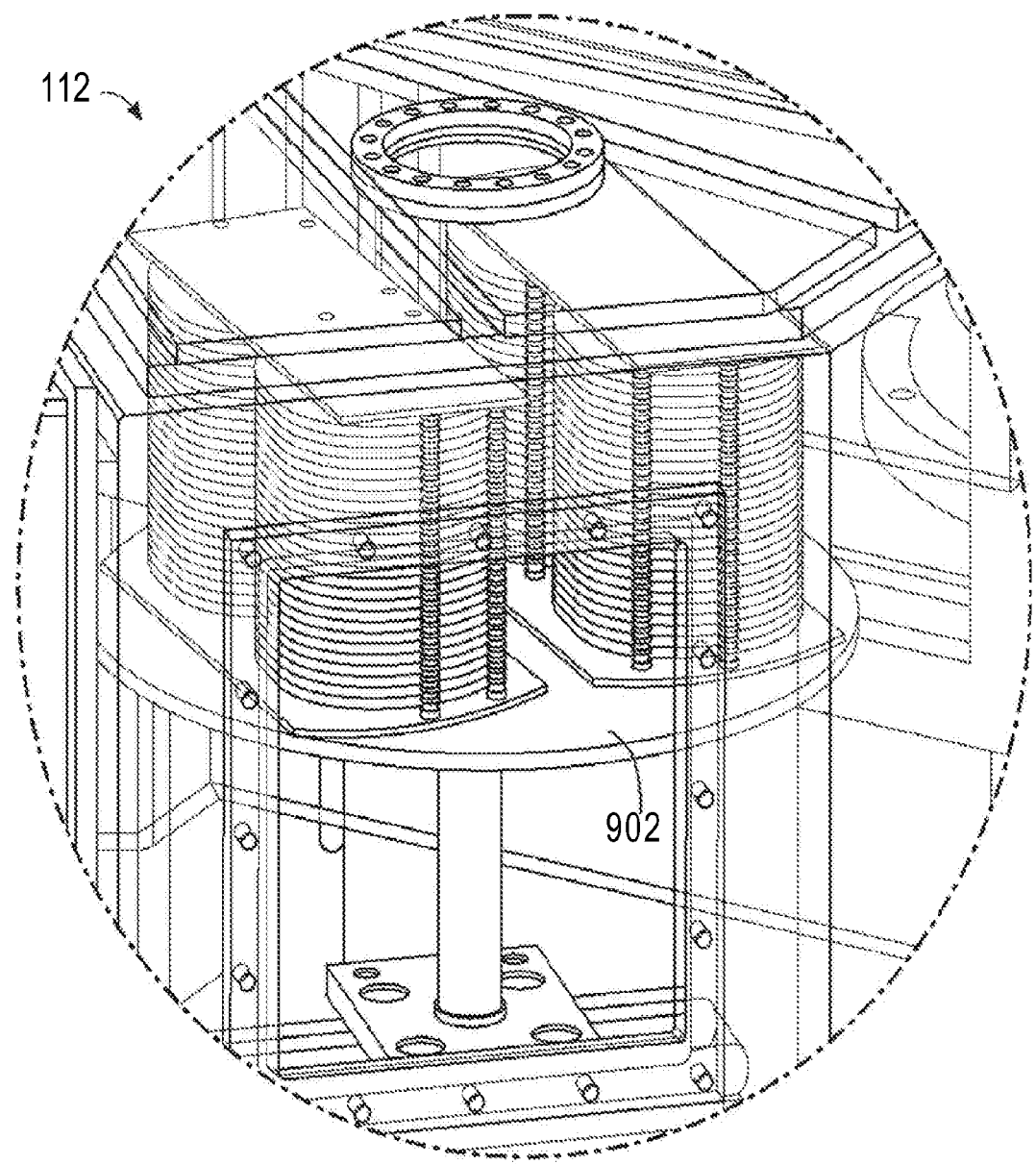
FIG. 9 shows a load lock with a turntable configured to support two transportable wafer racks.

FIG. 9 shows another example of a load lock 112 that includes a turntable 902 that is configured to support two transportable wafer racks, for example, two racks that may each contain 50+ wafers at 100 mm and 150 mm resulting in 100 wafers per batch, or each rack may contain 25+ wafers each at 200 mm, resulting in 50 wafers per batch. The illustrated example shows turntable 902 supporting two of dual column transportable wafer racks 300. In such an example, a method of loading the transportable wafer racks may include loading a first one of the racks adjacent load station 116 and then rotating the turntable approximately 180 degrees and loading the second rack, and then closing valves 122 and 124 and purging and drawing vacuum in the load lock chamber.

VTM

Figure 10:
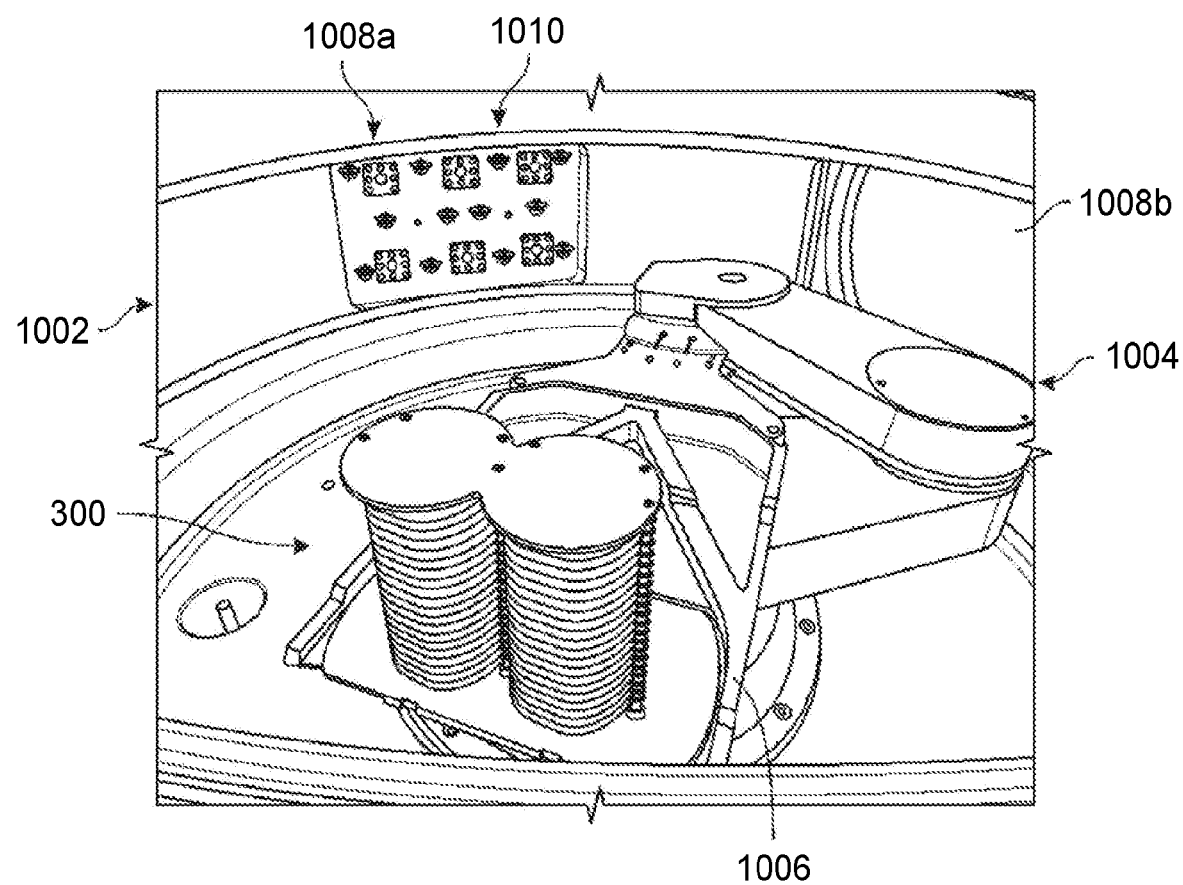
FIG. 10 shows one example of an interior chamber of a VTM.

FIG. 10 illustrates one example of an interior chamber 1002 of VTM 102. In the illustrated example, VTM 102 includes a robotic arm 1004 that is configured to move transportable wafer racks, such as wafer racks 200 and 300, throughout the system. In the illustrated example, robotic arm 1004 includes a pivotable shoulder, a first arm segment, a pivotable elbow, a second arm segment, a pivotable wrist, and an end effector 1006. FIG. 10 shows one of wafer racks 300 loaded with a plurality of wafers positioned on end effector 1006. As noted above, VTM 102 includes a plurality of openings configured to couple to various modules of system 100. FIG. 10 shows two openings 1008a, 1008b. One of preheat chambers 108 is coupled to opening 1008b and FIG. 10 shows one of heated gate valves 126b in a closed position in opening 1008b. Reactor 106 is coupled to opening 1008a and a reactor door 1010 is shown in a closed position in FIG. 10. VTM robotic arm 1004 is configured to rapidly, e.g., in less than one minute, transport wafer racks from preheat chambers 108 to reactor 106 for processing so that a temperature of the heated wafers when the wafers are deposited in the reactor is substantially the same as the temperature of the wafers in the preheat chamber.

Figure 11:
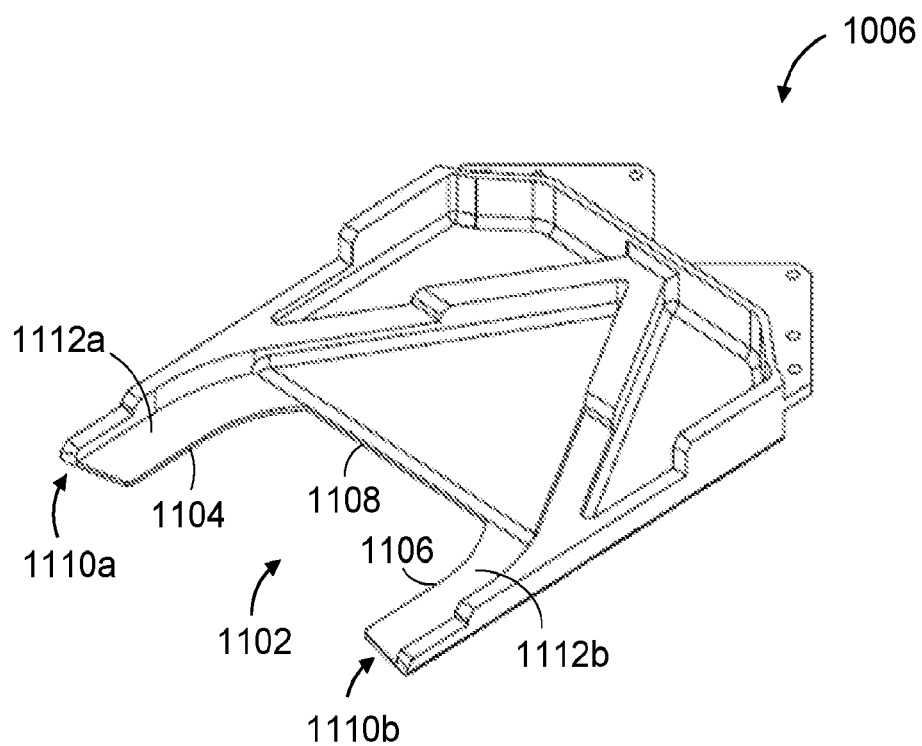
FIG. 11 is a perspective view of a VTM robot end effector.

FIG. 11 is a perspective view of VTM robot end effector 1006. As noted above, end effector 1006 is designed and configured as a universal end effector for coupling to a plurality of different transportable wafer racks, such as wafer racks 200 and 300. End effector 1006 includes a recess 1102 that has a complementary shape with respect to universal interface 204 of racks 200 and 300 (FIGS. 2 and 3) for coupling with the racks. In the illustrated example, the robotic arm 1004 is configured to couple to a base of the wafer racks and lift the wafer rack and maintain the wafer rack in a vertical position as the robotic arm moves the wafer rack throughout the system. Recess 1102 includes first and second opposed sides 1104, 1106 and a third side 1108 configured to mate with first and second curved ends 206, 208 and first or second flat side 210, 212 of universal interface 204 of rack 200 or 300 (see FIGS. 2A-3B). End effector also includes opposed arms 1110a, 1110b that each include a flat top surface 1112a, 1112b configured to come into contact with bottom surfaces 228 or 328 of bottom plates 222 or 322 of rack 200 or 300. In other examples, a VTM robotic arm may be configured to also couple to the top of a transportable wafer rack, or only couple to the top of the wafer rack, and in some examples, the VTM robotic arm may be configured to rotate the wafer rack from a vertical to a horizontal orientation.

VTM 102 may include one or more presence sensors located throughout interior chamber 1002 to ensure reliable transfers of wafer racks into and out of the VTM. In one example, chamber 1002 may include through beam sensors located proximate or in each opening 1008 and configured to detect the presence of a wafer rack on the end effector 1006 to ensure a wafer rack transfer to or from the robotic arm 1004 was successful.

Preheat Chamber

Referring again to FIG. 1, preheat chambers 108 define an interior space that is sized to receive at least one transportable wafer rack loaded with wafers such as wafer rack 200 or 300 and in one example, the interior space is approximately the same size as an interior space of a process chamber of reactor 106. FIG. 1 shows preheat chamber 108a coupled to a power distribution module 132 for powering the preheat chamber and a pressure and flow control system 134 for providing gas media, such as nitrogen, argon, or helium for controlling the pressure and chemical makeup of the atmosphere in the preheat chamber during heating. The control system for system 100 may be configured to control pre-heat chamber to provide a specific heating profile and atmosphere as needed for a particular wafer size, type, number of wafers, and type of thin film deposition process that will be performed in reactor 106. Preheat chambers 108 may include any of a variety of heating system types, such as radiant heating elements, heating lamps, or tubular heaters coupled to the structure defining the interior space of the heater. In one example, a plurality of tubular heaters are coupled to an external wall of the preheat chamber and the preheat chamber includes a plurality of thermocouples to read wall temperatures and pressure within the chamber is controlled by isolating the chamber and flowing nitrogen through a two stage vent valve until the desired pressure is achieved.

Method of Operation

Figure 12:
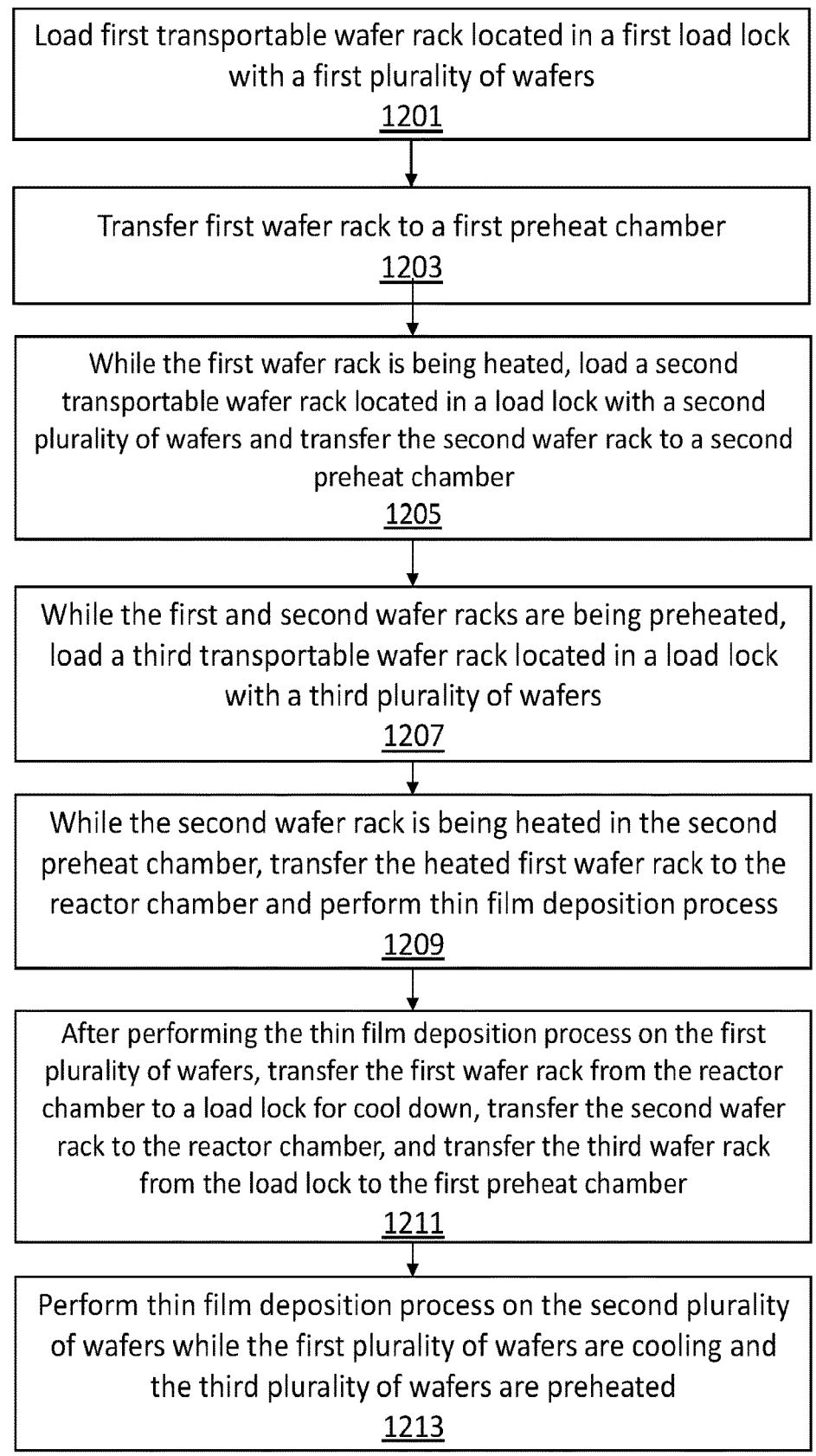
FIG. 12 illustrates one example method of performing an automated batch production thin film deposition process using a modular thin film deposition system.

FIG. 12 illustrates one example of a method 1200 of performing an automated batch production thin film deposition process using a modular thin film deposition system such as system 100. In the illustrated example, at block 1201, the method may include loading a first transportable wafer rack, such as wafer rack 200 or 300 that is located in a first load lock, such as one of load locks 112 with a first plurality of wafers. Block 1201 may be automatically performed by a load station robot, such as robot 404. At block 1203, transferring the first wafer rack to a first preheat chamber, such as one of preheat chambers 108. Block 1203 may be performed by a VTM robot such as VTM robot 1004. At block 1205, while the first wafer rack is being heated, load a second transportable wafer rack located in a load lock with a second plurality of wafers and transfer the second wafer rack to a second preheat chamber. At block 1207, while the first and second wafer racks are being preheated, load a third transportable wafer rack located in a load lock with a third plurality of wafers. At block 1209, while the second wafer rack is being heated in the second preheat chamber, transfer the heated first wafer rack to a reactor chamber, such as reactor 106, and perform a thin film deposition process, such as an ALD process. At block 1211, after performing the thin film deposition process on the first plurality of wafers, transfer the first wafer rack from the reactor chamber to a load lock for cool down, and transfer the second wafer rack to the reactor chamber, and transfer the third wafer rack from the load lock to the first preheat chamber. And at 1213, perform a thin film deposition process on the second plurality of wafers while the first plurality of wafers are cooling and the third plurality of wafers are preheated. The steps of method 1200 may be performed by a control system operating a batch production thin film deposition system such as system 100 executing a batch production software program with instructions for performing method 1200.

As illustrated by method 1200, a modular system such as system 100 provides distinct advantages for significantly increasing throughput and reducing processing cost per wafer. By decoupling the time consuming heat up and cool down phases from the thin film deposition phase, multiple racks of wafers can be processed in parallel.

Figure 13:
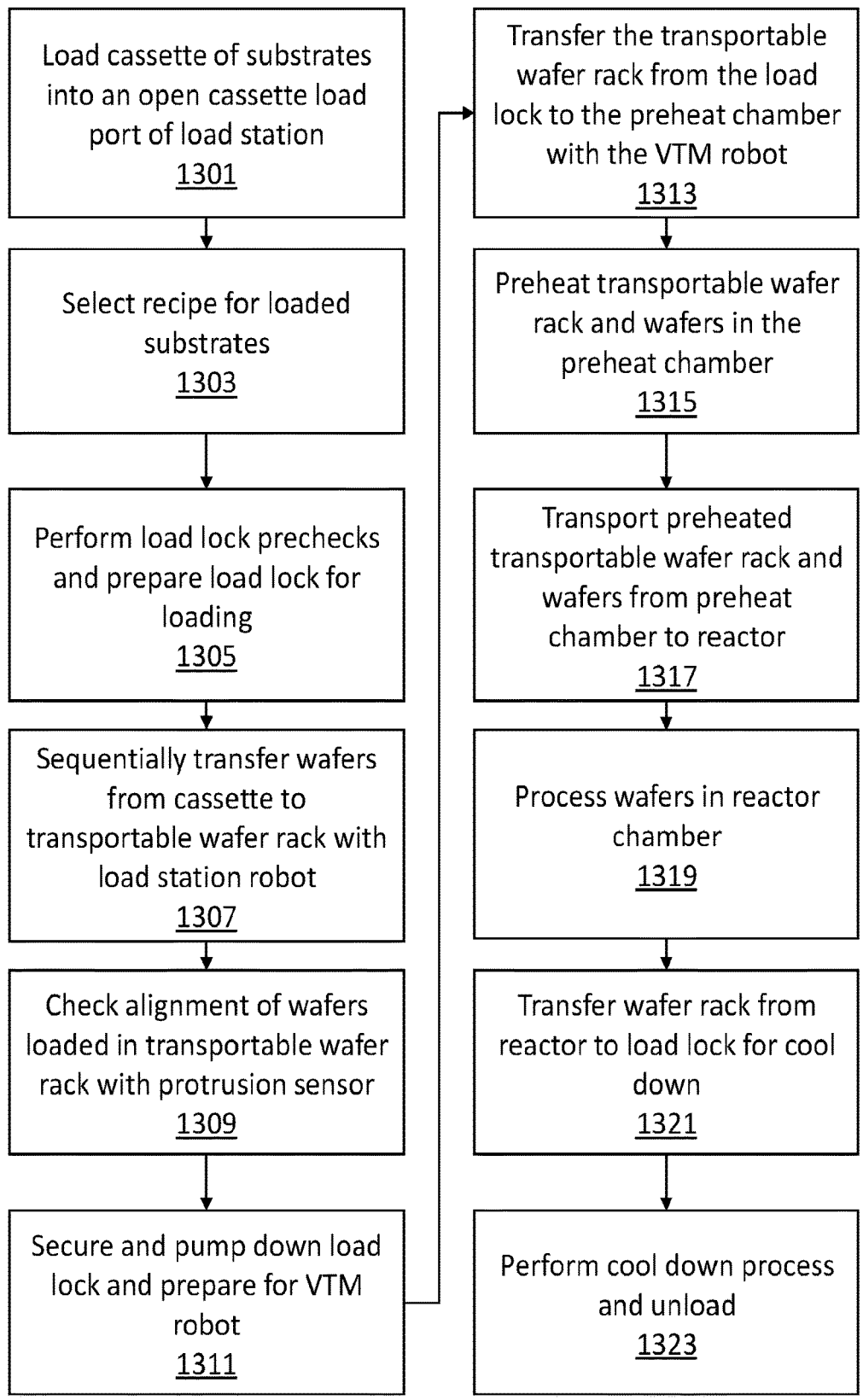
FIG. 13 illustrates another example method of performing an automated batch production thin film deposition process using a modular thin film deposition system.

FIG. 13 illustrates one example of a method 1300 of performing an automated batch production of a thin film deposition process using a modular thin film deposition system such as system 100. In the illustrated example, at block 1301, the method may include loading a cassette of substrates into an open cassette load port of a load station, such as a load port 118 of load station 116. At block 1303, select a "recipe" for the loaded substrates. In one example, the recipe specifies the type of thin film deposition process to be performed and key process parameters, which are used as input to a control system for automatedly performing the deposition process. In one example, a recipe may include identification of wafer characteristics, e.g., size, flat or notch, material and cassette type, identification of wafer rack, loading preference for wafers in rack (top to bottom, etc.), preheat recipe, e.g., temperature, time, pressure for preheat chamber, thin film deposition reactor recipe, and a load lock cooldown recipe, e.g., time and pressure within load lock. The recipe may also include a wafer alignment specification, e.g., angle, wafer ID, a transfer pressure within the VTM, pressure differentials for gate valves, specified load locks for loading and unloading (e.g., use the same for both in and out or different. The recipe may also include specification of load lock pump and purge cycles, and preheat chamber(s) idle temperature.

At block 1305, perform load lock prechecks and prepare load lock for loading. In some examples, load lock prechecks may include one or more of checking that the correct transportable wafer racks are loaded in load locks, for example, by reading a machine readable code located on the rack. Venting the load lock, checking turntable position, and mapping the rack to ensure there are no wafers in the rack. At block 1307, sequentially transfer wafers from cassette to transportable wafer rack with load station robot, and at block 1309, check alignment of wafers loaded in transportable wafer rack with a protrusion sensor located in the load lock. At 1311, secure and pump down the load lock and prepare for VTM robot. In one example, after the wafers are loaded in the transportable wafer rack, the load lock door is closed and one or more pump and purge cycles are performed until the interior of the load lock is at a target vacuum pressure. The control system may also rotate the load lock turntable to a correct position for transfer to the VTM robot and a second wafer protrusion check may be performed with the protrusion sensor.

At block 1313, transfer the transportable wafer rack from the load lock to the preheat chamber with the VTM robot. After the load lock is at the correct pressure, the control system may open the gate valve and the VTM robotic arm may extend through the gate valve and into the load lock chamber until the robotic arm end effector has engaged the base of the transportable wafer rack. The control system may then cause the robotic arm to lift the entire rack of wafers from the load lock turntable and retract the arm and wafer rack into the VTM chamber. The control system may then use one or more presence sensors located in the VTM chamber to confirm the presence of the wafer rack on the robotic arm end effector to confirm the transfer was successful. Upon confirmation of a successful transfer, the control system may then close the load lock gate valve and open the preheated gate valve and transport the rack of wafers into the preheat chamber for heating.

At block 1315, preheat transportable wafer rack and wafers in the preheat chamber. After depositing the wafer rack in the preheat chamber, the control system may retract the robotic arm into the VTM chamber, confirm a successful transfer with the VTM presence sensors, close the heated gate valve, and initiate a preheating sequence according to the selected recipe. At block 1317, transport the preheated transportable wafer rack and wafers from the preheat chamber to the reactor. After the preheating process is complete and the rack of wafers has reached the specified temperature, the control system may open the heated gate valve and the reactor chamber door, extend the VTM robotic arm into the preheat chamber, engage and lift the preheated wafer rack and then rapidly transfer the preheated wafer rack from the preheat chamber into the VTM chamber and from the VTM chamber, into the reactor chamber for processing.

At block 1319, process wafers in the reactor chamber. After depositing the wafer rack in the reactor chamber, the control system may retract the robotic arm from the reactor chamber and into the VTM chamber, confirm a successful transfer with the VTM presence sensors, close the reactor chamber door, and initiate a thin film deposition sequence according to the selected recipe. At block 1321, transfer the wafer rack from the reactor to a load lock for cool down. After the thin film deposition process is complete, the control system can open the reactor gate valve, extend the VTM robot into the reactor chamber, engage and lift the wafer rack and transport the wafer rack from the reactor chamber, through the VTM chamber, to the specified load lock for cool down.

At block 1323, perform a cool down process and unload. After confirming a successful transfer of the wafer rack to the load lock with the VTM presence sensors, the control system may close the load lock gate valve and initiate a cool down process according to the selected recipe. After the cool down process is complete, the control system may confirm all wafers in the rack are aligned with the load lock alignment sensors and then rotate the turntable to the correct position for wafer unload by the load station robot. The system may also confirm the wafer temperature sensor is reading below a target value, e.g., 50° C., and then vent the load lock and open the load station load lock door. The load station robot may then sequentially transfer the cooled and processed wafers from the wafer rack to a cassette for removal by an operator.

Other than steps 1301 and 1303, method 1300 may be performed by a control system operating a batch production thin film deposition system such as system 100 executing a batch production software program with instructions for performing method 1300. As will be appreciated, a number of distinct advantages are provided by method 1300, including the ability to concurrently process a plurality of wafers located on a transportable wafer rack while only physically contacting individual wafers when they are at room temperature in the load station of the system. By avoiding all handling or physical contact of individual wafers during the heat up, film deposition, and cool down phases, the likelihood of wafer damage is significantly reduced.

Any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 14:
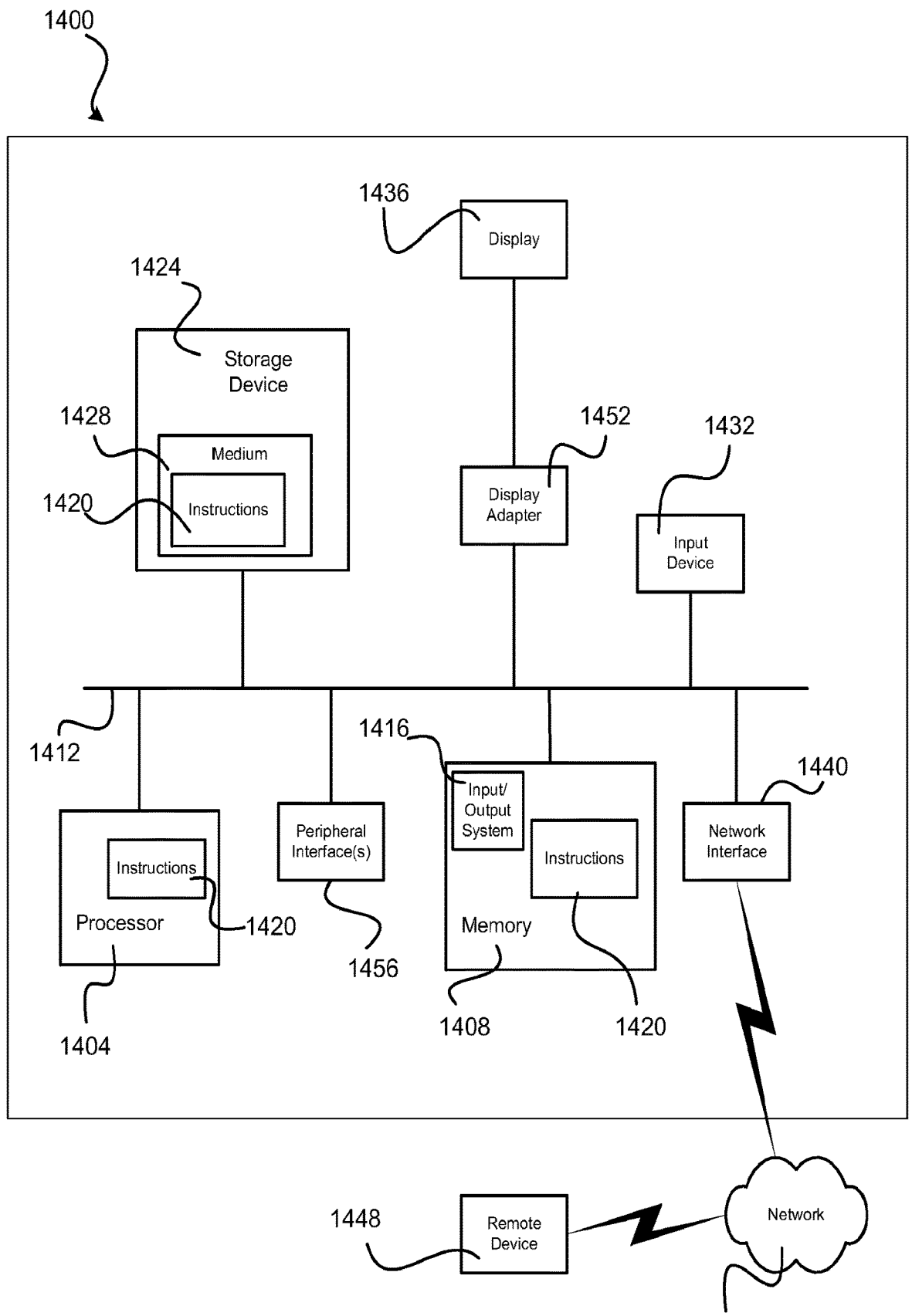
FIG. 14 is a functional block diagram of components of a computing system for use with modular thin film deposition system of the present disclosure.

FIG. 14 shows a diagrammatic representation of one embodiment of a computing device in the exemplary form of a computer system 1400 within which a set of instructions for causing a control system, such as the control system for controlling system 100 of FIG. 1A, to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 1400 includes a processor 1404 and a memory 1408 that communicate with each other, and with other components, via a bus 1412. Bus 1412 may include any of several types of bus structures including, but not limited to, a memory bus, a memory controller, a peripheral bus, a local bus, and any combinations thereof, using any of a variety of bus architectures.

Memory 1408 may include various components (e.g., machine-readable media) including, but not limited to, a random access memory component, a read only component, and any combinations thereof. In one example, a basic input/output system 1416 (BIOS), including basic routines that help to transfer information between elements within computer system 1400, such as during start-up, may be stored in memory 1408. Memory 1408 may also include (e.g., stored on one or more machine-readable media) instructions (e.g., software) 1420 embodying any one or more of the aspects and/or methodologies of the present disclosure. In another example, memory 1408 may further include any number of program modules including, but not limited to, an operating system, one or more application programs, other program modules, program data, and any combinations thereof.

Computer system 1400 may also include a storage device 1424. Examples of a storage device (e.g., storage device 1424) include, but are not limited to, a hard disk drive, a magnetic disk drive, an optical disc drive in combination with an optical medium, a solid-state memory device, and any combinations thereof. Storage device 1424 may be connected to bus 1412 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 1424 (or one or more components thereof) may be removably interfaced with computer system 1400 (e.g., via an external port connector (not shown)). Particularly, storage device 1424 and an associated machine-readable medium 1428 may provide nonvolatile and/or volatile storage of machine-readable instructions, data structures, program modules, and/or other data for computer system 1400. In one example, software 1420 may reside, completely or partially, within machine-readable medium 1428. In another example, software 1420 may reside, completely or partially, within processor 1404.

Computer system 1400 may also include an input device 1432. In one example, a user of computer system 1400 may enter commands and/or other information into computer system 1400 via input device 1432. Examples of an input device 1432 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 1432 may be interfaced to bus 1412 via any of a variety of interfaces (not shown) including, but not limited to, a serial interface, a parallel interface, a game port, a USB interface, a FIREWIRE interface, a direct interface to bus 1412, and any combinations thereof. Input device 1432 may include a touch screen interface that may be a part of or separate from display 1436, discussed further below. Input device 1432 may be utilized as a user selection device for selecting one or more graphical representations in a graphical interface as described above.

A user may also input commands and/or other information to computer system 1400 via storage device 1424 (e.g., a removable disk drive, a flash drive, etc.) and/or network interface device 1440. A network interface device, such as network interface device 1440, may be utilized for connecting computer system 1400 to one or more of a variety of networks, such as network 1444, and one or more remote devices 1448 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 1444, may employ a wired and/or a wireless mode of communication. In general, any network topology may be used. Information (e.g., data, software 1420, etc.) may be communicated to and/or from computer system 1400 via network interface device 1440.

Computer system 1400 may further include a video display adapter 1452 for communicating a displayable image to a display device, such as display device 1436. Examples of a display device include, but are not limited to, a liquid crystal display (LCD), a cathode ray tube (CRT), a plasma display, a light emitting diode (LED) display, and any combinations thereof. Display adapter 1452 and display device 1436 may be utilized in combination with processor 1404 to provide graphical representations of aspects of the present disclosure. In addition to a display device, computer system 1400 may include one or more other peripheral output devices including, but not limited to, an audio speaker, a printer, and any combinations thereof. Such peripheral output devices may be connected to bus 1412 via a peripheral interface 1456. Examples of a peripheral interface include, but are not limited to, a serial port, a USB connection, a FIREWIRE connection, a parallel connection, and any combinations thereof.

Figure 15:
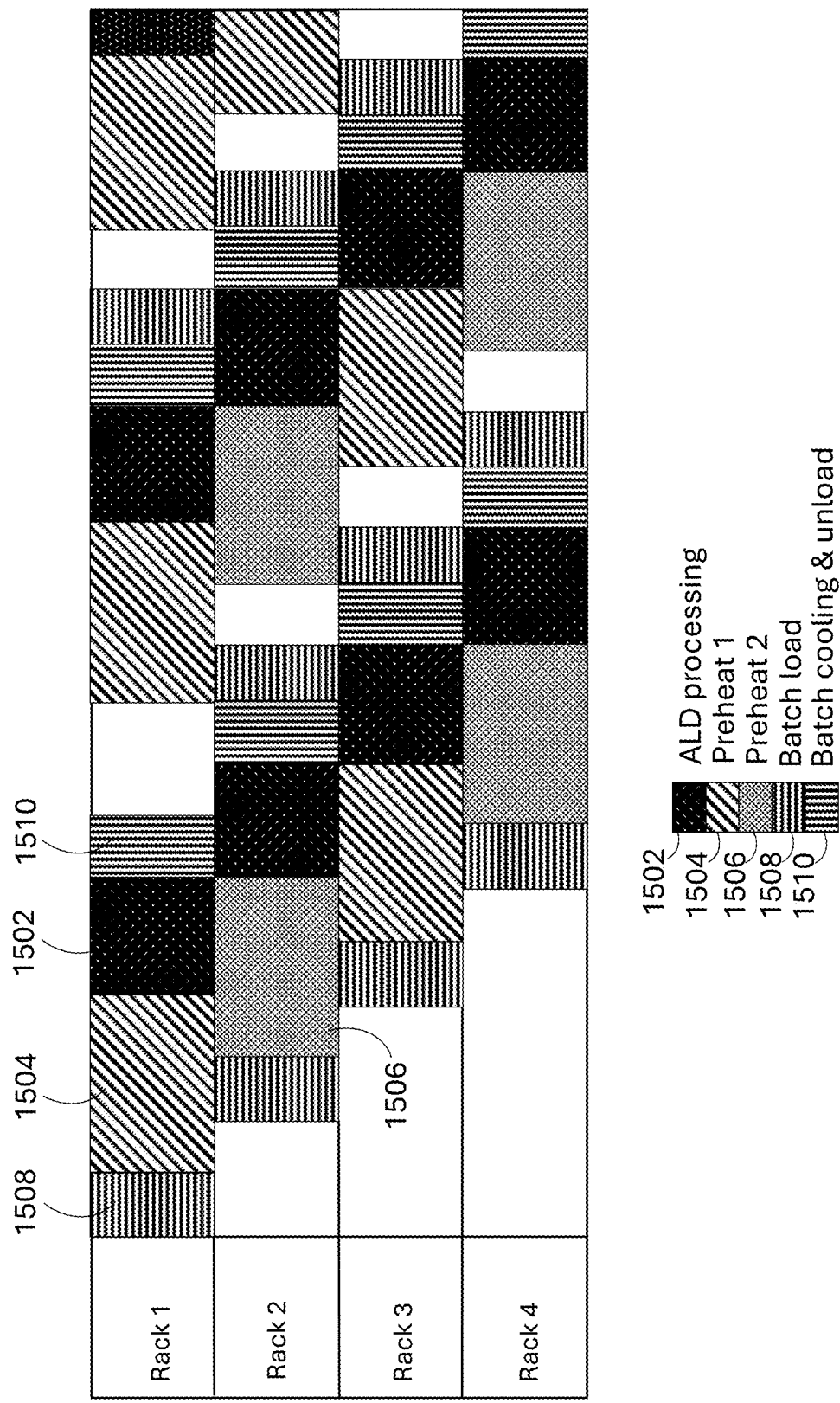
FIG. 15 is a timeline that conceptually illustrates the concurrent processing of four transportable wafer racks using a modular thin-film deposition system of the present disclosure.

FIG. 15 is a timeline that conceptually illustrates the concurrent processing of four transportable wafer racks using a modular thin-film deposition system of the present disclosure, such as system 100. Each row represents the sequential processing phases for a particular wafer rack versus time. FIG. 15 shows an ALD processing phase 1502 performed in a thin-film deposition reactor, such as reactor 106, two different preheat phases, preheat phase 1, 1504, and phase 2, 1506 corresponding to preheating in one of two preheat chambers, such as preheat chambers 108*a* and 108*b*, a batch load phase 1508, which may occur in a load lock, such as load lock 112*a* or 112*b*, and a batch cool and unload phase 1510, which may also occur in one of the load locks. FIG. 15 shows how system 100 can be used to continuously process four transportable wafer racks, such as rack 200 or 300 at once. FIG. 15 conceptually illustrates the relative time durations of each phase for one example, showing how the preheat phase (1504/1506) is relatively long. As noted above, one benefit of system 100 is the preheat and cooldown phases can each be decoupled from the thin-film deposition phase. As shown in FIG. 15, each rack can be preheated while the previously-numbered rack is undergoing ALD processing and each rack can be cooled down in a load lock such that the reactor can immediately transition to the next wafer rack rather than be occupied for cooldown, thereby significantly increasing the throughput of the system.

The foregoing has been a detailed description of illustrative embodiments of the invention. It is noted that in the present specification and claims appended hereto, conjunctive language such as is used in the phrases "at least one of X, Y and Z" and "one or more of X, Y, and Z," unless specifically stated or indicated otherwise, shall be taken to mean that each item in the conjunctive list can be present in any number exclusive of every other item in the list or in any number in combination with any or all other item(s) in the conjunctive list, each of which may also be present in any number. Applying this general rule, the conjunctive phrases in the foregoing examples in which the conjunctive list consists of X, Y, and Z shall each encompass: one or more of X; one or more of Y; one or more of Z; one or more of X and one or more of Y; one or more of Y and one or more of Z; one or more of X and one or more of Z; and one or more of X, one or more of Y and one or more of Z.

Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve aspects of the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A control system for controlling a thin film deposition system, the thin film deposition system including a vacuum transfer module (VTM), a VTM robot located in the VTM, a load lock, a preheat chamber, a thin film deposition reactor, and at least one transportable wafer rack, the control system comprising:
a processor and a memory containing machine-readable instructions for causing the processor to control the thin film deposition system to perform operations comprising:
a first transfer, with the VTM robot, of the at least one transportable wafer rack from the load lock, through the VTM, to the preheat chamber, the at least one transportable wafer rack loaded with a plurality of wafers;
heating the at least one transportable wafer rack and the plurality of wafers in the preheat chamber;
a second transfer, with the VTM robot, of the at least one transportable wafer rack and the plurality of wafers from the preheat chamber, through the VTM, to the reactor;
performing a thin film deposition process on the plurality of wafers in the reactor;
a third transfer, with the VTM robot, of the at least one transportable wafer rack and the plurality of wafers from the reactor, through the VTM, to the load lock; and
performing a controlled cool down process on the at least one transportable wafer rack and plurality of wafers in the load lock.

2. The control system of 1, wherein the thin film deposition system further includes a load station, the load station including a load port and a robotic arm, the operations further comprising:
sequentially transferring, with the load station robotic arm, the plurality of wafers between a wafer cassette located in the load port and the at least one transportable wafer rack when the at least one transportable wafer rack is located in the load lock.

3. The control system of claim 2, wherein the load lock includes a turntable configured to support the at least one transportable wafer rack, the operations further comprising:
positioning the turntable and the at least one transportable wafer rack at a first rotational position for the sequentially transferring step; and
positioning the turntable and the at least one transportable wafer rack at a second rotational position for the first transfer and the third transfer.

4. The control system of claim 1, wherein the at least one transportable wafer rack includes a plurality of transportable wafer racks, each of the plurality of transportable wafer racks loaded with a corresponding plurality of wafers, the operations further comprising:
concurrently performing the heating step on a first one of the plurality of transportable wafer racks loaded with a first plurality of wafers, the thin film deposition process on a second one of the plurality of transportable wafer racks loaded with a second plurality of wafers, and the controlled cool down process on a third one of the plurality of transportable wafer racks loaded with a third plurality of wafers.

5. The control system of claim 4, wherein at least one of the first, second, and third plurality of wafers have a different size than another one of the first, second, and third plurality of wafers.

\* \* \* \* \*